United States Patent

Murakami et al.

[11] Patent Number: 5,905,129
[45] Date of Patent: May 18, 1999

[54] RING-OPENING POLYMER HYDROGENATION PRODUCTS

[75] Inventors: Toshihide Murakami, Tokyo; Mitsushi Tada, Kamakura; Yasuo Tsunogae, Kawasaki, all of Japan

[73] Assignee: Nippon Zeon Co., Ltd., Tokyo, Japan

[21] Appl. No.: 08/809,298

[22] PCT Filed: Sep. 29, 1995

[86] PCT No.: PCT/JP95/01992

§ 371 Date: Mar. 27, 1997

§ 102(e) Date: Mar. 27, 1997

[87] PCT Pub. No.: WO96/10596

PCT Pub. Date: Apr. 11, 1996

[30] Foreign Application Priority Data

Sep. 30, 1994 [JP] Japan .................................. 6-261706

[51] Int. Cl.⁶ .............................. C08F 8/04; C08F 32/08
[52] U.S. Cl. ...................... 526/281; 525/332.1; 525/338; 526/280; 526/326.1
[58] Field of Search ..................... 526/281, 280; 525/332.1, 338

[56] References Cited

U.S. PATENT DOCUMENTS

| | | | |
|---|---|---|---|
| 4,166,083 | 8/1979 | Ueda | 526/281 |
| 5,106,920 | 4/1992 | Murakami | 525/326.1 |
| 5,559,199 | 9/1996 | Abe | 526/160 |

FOREIGN PATENT DOCUMENTS

| | | |
|---|---|---|
| 0 375 780 A | 7/1990 | European Pat. Off. . |
| 0 559 146 A | 9/1993 | European Pat. Off. . |
| 63-223013 | 9/1988 | Japan . |
| 63-145324 A | 10/1988 | Japan . |
| 3-220230 | 9/1991 | Japan . |
| 03273043 | 12/1991 | Japan . |
| 3-273043 | 12/1991 | Japan . |
| 3273043 | 12/1991 | Japan . |
| 7-53680 | 2/1995 | Japan . |

*Primary Examiner*—Fred Zitomer
*Attorney, Agent, or Firm*—Armstrong, Westerman, Hattori, McLeland & Naughton

[57] ABSTRACT

A thermoplastic norbornene resin having a number-average molecular weight (Mn) of 12,000 or more in terms of polyisoprene value measured by gel permeation chromatography and excellent in low birefringence property and resistance to deterioration with greases and oils is obtained by ring-opening polymerizing a polycyclic norbornene monomer containing at least 70% by weight of a norbornene monomer represented by the following formula I (for example, 1,4-methano-1,4,4a,9a-tetrahydrofluorene):

FORMULA I

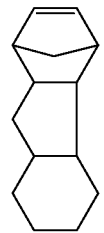

(wherein the lower 6-membered ring structure may have a double bond) and hydrogenating the polymer so that the hydrogenation rate of double bond in the main chain is at least 98% and the hydrogenation rate of the 6-membered ring structure is at least 90%.

10 Claims, No Drawings

RING-OPENING POLYMER HYDROGENATION PRODUCTS

TECHNICAL FIELD

The present invention relates to ring-opening polymerization polymer hydrogenation products, and more particularly, to ring-opening polymerization polymer hydrogenation products excellent in low birefringence properties and resistance to deterioration with greases and oils.

BACKGROUND ART

Hitherto, polymethyl methacrylate (PMMA) and polycarbonate (PC) have been known as optical polymer materials. However, PMMA is excellent in transparency, but has problems in heat resistance and moisture resistance. PC is superior to PMMA in heat resistance and moisture resistance, but has the problem that it is apt to have a high birefringence due to its basic structure having a benzene ring and its high melt viscosity.

Recently, ring-opening polymerization polymer hydrogenation products of norbornene monomers are used as polymer materials improved in these defects. These resins are excellent in heat resistance and moisture resistance and, furthermore, have low birefringence. However, resins of further lower birefringence are required by the further advancing technical demand.

1,4-Methano-1,4,4a,9a-tetrahydrofluorene (hereinafter referred to as "MTF") is a monomer disclosed as an example of the norbornene monomers (e.g., JP-A-3-273043, etc.). However, no examples of ring-opening polymerizing the monomer and hydrogenating the polymer are disclosed in the prior art. Therefore, no characteristics have been known on the ring-opening polymerization polymer hydrogenation products of MTF. Furthermore, hydrogenation products of ring-opening polymerization copolymers of 1,4-methano-1, 4,4a,4b,5,8,8a,9a-octahydro-9H-fluorene having the similar structure to MTF (differing from MTF in that the aromatic ring structure of MTF is replaced with a cyclohexene ring structure) and 5,8-methano-3a,4a,5,8,8a,9,9a-octahydro-1H-benzoindene at a molar ratio of 4:6–6:4 are known (JP-A-3-220230). The resins have a small birefringence and have a strength and a heat resistance. However, they do not have such level of low birefringence as newly required.

Moreover, the norbornene ring-opening polymerization polymer hydrogenation products suffer from the problem that they sometimes undergo reduction in mechanical strength when greases and oils stick thereto to cause breakage.

DISCLOSURE OF INVENTION

As a result of intensive research conducted by the inventors on norbornene ring-opening polymerization polymer hydrogenation products of lower birefringence, it has been found that ring-opening polymerization polymer hydrogenation products of specific monomers have lower birefirngence and, in addition, they are excellent in resistance to deterioration with greases and oils when they have a molecular weight higher than a certain level. Thus, the present invention has been accomplished.

BEST MODE FOR CARRYING OUT THE INVENTION

Thus, the present invention provides a ring-opening polymerization polymer hydrogenation product comprising 70–100% by weight, preferably 90–100% by weight of a norbornene monomer represented by the following formula I and 0–30% by weight, preferably 0–10% by weight of other monomer copolymerizable with the said norbornene monomer, the hydrogenation rate of the double bond in the main chain being 98% or higher, the hydrogenation rate of the 6-membered ring structure being 90% or higher, the number-average molecular weight (Mn) measured by gel permeation chromatography being 12,000 or more in terms of polyisoprene:

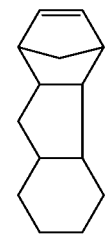

(wherein the 6-membered ring structure positioned lower may have a double bond).

Examples of the monomer used in the present invention are 1,4-methano-1,4,4a,4b,5,8,8a,9a-octahydro-9H-fluorene, 1,4-methano-1,4,4a,4b,5,6,7,8,8a,9a-decahydro-9H-fluorene and MTF, and preferred is MTF which is easy in preparation and purification. For example, MTF can be obtained by subjecting indene and cyclopentadiene to Diels-Alder reaction.

In the present invention, monomers which are ring-opening copolymerizable with the monomers represented by the formula I may be used in combination. These monomers include norbornene monomers known in JP-A-51-80400, JP-A-60-26024, JP-A-1-168725, JP-A-1-190726, JP-A-3-14882, JP-A-3-122137, JP-A-4-63807, JP-A-2-227424, JP-A-2-276842, etc. Examples are norbornenes and their alkyl, alkylidene and aromatic substitution derivatives, and these substituted or unsubstituted olefins which are substituted with polar groups such as halogen, hydroxyl group, ester group, alkoxy group, cyano group, amide group, imide group and silyl group, such as, for example, 2-norbornene, 5-methyl-2-norbornene, 5,5-dimethyl-2-norbornene, 5-ethyl-2-norbornene, 5-butyl-2-norbornene, 5-ethylidene-2-norbornene, 5-methoxycarbonyl-2-norbornene, 5-cyano-2-norbornene, 5-methyl-5-methoxycarbonyl-2-norbornene, 5-hexyl-2-norbornene, 5-octyl-2-norbornene, 5-octadecyl-2-norbornene, etc.; monomers which are norbornenes to which at least one cyclopentadiene is added, and their derivatives and substituted products similar to those mentioned above, such as, for example, 1,4:5,8-dimethano-1,2, 3,4,4a,5,8,8a-octahydro-2,3-cyclo-pentadienonaphthalene, 6-methyl-1,4:5,8-dimethano-1,4,4a,5,6,7,8,8a-octahydronaphthalene, 1,4:5,10:6,9-trimethano-1,2,3,4,4a, 5,5a,6,9,9a,10,10a-dodecahydro-2,3-cyclopentadienoanthracene, etc.; monomers of polycyclic structure obtained by polymerizing cyclopentadiene, and their derivatives and substituted products similar to those mentioned above, such as, for example, dicyclopentadiene, 2,3-dihydrodicyclopentadiene, etc.; monocyclic cycloolefins such as cyclobutene, 1-methylcyclopentene, 3-methylcyclobutene, 3,4-diisopropenylcyclobutene, cyclopentene, 3-methylcyclopentene, cyclooctene, 1-methylcyclooctene, 5-methylcyclooctene, cyclooctatetraene, 1,5-cyclooctadine, cyclodecene, etc.; acetylene and substituted acetylenes such as propyne, 1-butene, etc.; dienes having double bonds at both end portions, such as 1,6-heptadiene; etc. The amount of the monomers other than the monomers represented by the formula I varies depending on the reactivity of these monomers, but is such that the resulting ring-opening polymerization polymer has the recurring structural unit derived from the monomer represented by the formula I in an amount of 70% by weight or more, preferably 80% by weight or more, more preferably 90% by weight or more. If the amount of the recurring structural unit derived from the formula I in the polymer is too small, the polymer hydrogenation products do not have low birefringence and sometimes decrease in mechanical strength when greases or oils stick thereto.

The method for ring-opening polymerization of these monomers is not especially limited and the ring-opening polymerization may be carried out using metathesis polymerization catalysts. The metathesis polymerization catalysts are those which are known in JP-B-41-20111, JP-A-46-14910, JP-B-57-17883, JP-B-57-61044, JP-A-54-86600, JP-A-58-127728, JP-A-1-240517, etc., and they consist essentially of (a) a transition metal compound catalyst component and (b) a metal compound promoter component.

The transition metal compound catalyst component (a) used for the metathesis polymerization catalysts is a compound of transition metals of Group IVB, VB, VIB, VIIB or VIII of Deming's periodic table. As examples of the compound, mention may be made of halides, oxyhalides, alkoxyhalides, alkoxides, carboxylates, (oxy)acetylacetonates, carbonyl complexes, acetonitrile complexes, hydride complexes, derivatives thereof, and these compounds or derivatives thereof which are complexed with a complexing agent such as $P(C_5H_5)_3$. Typical examples of the compounds are $TiCl_4$, $TiBr_4$, $VOBr_3$, $WBr_4$, $WBr_6$, $WCl_2$, $WCl_4$, $WCl_5$, $WCl_6$, $WF_4$, $WI_2$, $WOCl_4$, $MoBr_2$, $MoBr_3$, $MoBr_4$, $MoCl_4$, $MoF_4$, $MoOCl_4$, $WO_2$, $H_2WO_4$, $NaWO_4$, $K_2WO_4$, $(H_4N)_2WO_4$, $CaWO_4$, $CuWO_4$, $MgWO_4$, etc.

The metal compound promoter component (b) used for the metathesis polymerization catalysts is a compound of a metal of Group IA, IIA, IIB, IIIA or IVA of Deming's periodic table which has at least one metal element-carbon bond or metal element-hydrogen bond, such as organic compounds of Al, Sn, Li, Na, Mg, Zn, Cd and B. As examples of the compound, mention may be made of organoaluminum compounds such as trimethylaluminum, triethylaluminum, tri-n-propylaluminum, triisopropylaluminum, triisobutylaluminum, triphenylaluminum and di-n-propylaluminum monochloride; organotin compounds such as tetramethyltin, diethyldimethyltin, tetraethyltin, dibutyldiethyltin and tetrabutyltin; organolithium compounds such as n-butyllithium; organosodium compounds such as n-pentylsodium; organomagnesium compounds such as methylmagnesium iodide, ethylmagnesium bromide, t-butylmagnesium chloride and allylmagnesium chloride; organozinc compounds such as diethylzinc; organocadmium compounds such as diethylcadmium; organoboron compounds such as trimethylboron; etc.

The metathesis polymerization activity can be increased by adding a third component in addition to the components (a) and (b). As the third component, mention may be made of aliphatic tertiary amines, aromatic tertiary amines, molecular oxygen, alcohols, ethers, peroxides, carboxylic acids, acid anhydrides, acid chlorides, esters, ketones, nitrogen-containing compounds, sulfur-containing compounds, halogen-containing compounds, molecular iodine, other Lewis acids, etc. Among them, aliphatic and aromatic tertiary amines or ethers are preferred. Examples thereof are triethylamine, dimethylaniline, tri-n-butylamine, pyridine, α-picoline, diethyl ether, di-i-propyl ether, di-n-butyl ether, etc. Compounds containing OH group such as alcohol act as a deactivating agent which hinders metathesis polymerization activity when added in an amount exceeding stoichiometric amount. Therefore, these compounds must be added in an amount less than the stoichiometric amount. Hereupon, the stoichiometric amount means the mol number which is represented by the value obtained by dividing the product of the mol number of the component (a) and the oxidation number of transition metal contained in the component (a) by the number of OH group per one molecule of the compound containing OH group.

Relationship of the amounts of these components is such that the amount of the metal element in the component (b) is 1 mol or more, preferably 2 mols or more and 100 mols or less, preferably 50 mols or less for 1 mol of the metal element in the component (a) and, usually, the amount of the third component is 0.005 mol or more, preferably 0.05 mol or more and 10 mols or less, preferably 3 mols or less for 1 mol of the component (a). If the amount of the component (b) is too small for the component (a), no sufficient activity is obtained for the amount of the component (a) and if it is too large, removal of the excess component (b) becomes difficult or cost increases. If the amount of the third component is too small for the component (a), the effect of addition of the third component is small and if it is too large, removal of the excess third component becomes difficult or cost increases.

The metathesis polymerization is carried out usually in an inert organic solvent. As examples of the inert organic solvent, mention may be made of aromatic hydrocarbons such as benzene and toluene; aliphatic hydrocarbons such as n-pentane and hexane; alicyclic hydrocarbons such as cyclohexane and decalin; ethers such as tetrahydrofuran and ethylene glycol dimethyl ether; etc. The ring-opening polymerization is carried out using the inert organic solvent in an amount of 0.8 part by weight or more, preferably 1 part by weight or more and 20 parts by weight or less, preferably 10 parts by weight or less for 1 part by weight of the monomer.

The resulting ring-opening polymerization polymers have a number-average molecular weight, in terms of polystyrene, of 12,000 or more, preferably 14,000 or more, more preferably 15,000 or more and 50,000 or less, preferably 40,000 or less, more preferably 30,000 or less measured by gel permeation chromatography method with a toluene solvent and a similarly measured weight-average molecular weight (Mw) of 20,000 or more, preferably 250,000 or more, more preferably 30,000 or more and 80,000 or less, preferably 70,000 or less, more preferably 60,000 or less.

Hydrogenation product

In the present invention, the ring-opening polymerization polymer is hydrogenated. The hydrogenation is carried out by allowing the resin to contact with hydrogen in the presence of a hydrogenation catalyst. The hydrogenation is usually carried out in a solvent, and the solvent may be the same as used for the polymerization. When the solvent of the polymerization reaction solution is used, as it is, as the solvent for hydrogenation reaction, it is not necessary to prepare a hydrogenation reaction solution after precipitation and coagulation of the resin, and the hydrogenation catalyst can be added to the polymerization reaction solution after the polymerization reaction to prepare a hydrogenation reaction solution. In this case, before addition of the hydrogenation catalyst, a deactivator for the polymerization catalyst, for example, alcohol such as methanol, butanol or isopropanol or a compound having OH group such as water may be added to the polymerization reaction solution to terminate the reaction. However, since addition of the deactivator causes decrease of hydrogenation activity and hydrogenation rate cannot be enhanced, it is preferred to carry out the hydrogenation without adding the deactivator. When a homogeneous catalyst is used, the deactivator greatly hinders the hydrogenation catalyst and, therefore, it is especially preferred to carry out the hydrogenation without adding the deactivator.

The hydrogenation catalyst may be either a homogeneous catalyst comprising (c) a transition metal compound and (d) a reducing metal compound or a heterogeneous catalyst comprising a catalyst metal supported on a carrier. Since the homogeneous catalyst is readily dispersible in the hydrogenation reaction solution, the amount may be small. Besides, since it has activity even not at high temperature and pressure, decomposition or gelation of the polymer does not occur and, thus, the cost is low and the polymer is excellent in stability of quality. The heterogeneous catalyst has high activity under high temperature and pressure, and the hydrogenation can be performed in a short period of time and, moreover, it is superior in production efficiency because removal of the catalyst is easy.

The homogeneous catalysts are those which are known in JP-A-58-43412, JP-A-60-26024, JP-A-64-24826, JP-A-1-138257, etc. As the transition metal compound (c), mention may be made of compounds of transition metals belonging to Group I or one of Groups IV–VIII of the Deming's periodic table, for example, halides, alkoxides, acetylacetonates, sulfanates, carboxylates, naphthenates, trifluoroacetates and stearates of transition metals such as Cr, Mo, Fe, Mn, Co, Ni, Pd and Ru. Typical examples of the compounds are manganese (III) acetylacetonate, cobalt (III) acetylacetonate, bis-(triphenylphosphine)-cobalt dichloride, nickel (II) acetylacetonate, bis-(tributylphosphine)-palladium, etc. The reducing metal compound (d) is a compound of a metal of Group IA, IIA, IIB, IIIA or IVA of Deming's periodic table which has at least one metal element-carbon bond or metal element-hydrogen bond, and examples are Al compound, Li compound, Zn compound, Mg compound, etc. As typical examples of the compound, mention may be made of trimethylaluminum, triphenylaluminum, diethylaluminum chloride, ethylaluminum sesquichloride, diethylaluminum hydride, n-propyllithium, sec-butyllithium, p-tolyllithium, etc. As for the combination of the components (c) and (d), specifically, catalysts comprising the combination of organometallic compounds, halides, alkoxides, acetylacetonates, sulfonates or naphthenates of Mn, Fe, Co or Ni as the component (c) with organic compounds or hydrides of Al, Li, Zn, Mg, etc. as the component (d) are highly active and subject to less influences of impurities such as hindrance to the reaction and decrease in activity and these combinations are preferred, and catalysts comprising the combination of organometallic compounds, halides, alkoxides or acetylacetonates of Ti, Fe, Co or Ni as the component (c) with alkylaluminums or alkyllithiums as the component (d) are especially high in activity and subject to the least influences of impurities such as hindrance to the reaction and decrease in activity and, therefore, these combinations are more preferred. Relationship of the amounts of these components depends on the kind of each component, but is generally 0.5 mol or more, preferably 1 mol or more and 50 mols or less, preferably 8 mols or less of the metal element of the component (d) for 1 mol of the metal element of the component (c). If the amounts of the components are too small or too large, the activity of hydrogenation reaction is insufficient. Especially, when the amounts are too large, gelation or side-reactions sometimes take place.

The heterogeneous catalysts are also known ones and there may be used, for example, those which comprise a hydrogenation catalyst metal such as Ni or Pd supported on a carrier. Particularly, when less incorporation of impurities or the like is desired, it is preferred to use an adsorbent such as alumina or diatomaceous earth as the carrier and, furthermore, it is preferred to use an alumina having a pore volume of 0.5 cm$^3$/g or more, preferably 0.7 cm$^3$/g or more, more preferably 250 cm$^2$/g or more. When such carrier is used, transition metal atoms or the like resulting from the catalyst used for the polymerization can be adsorbed and hydrogenation product of less impurities can be obtained.

The amount of the hydrogenation catalyst used for the hydrogenation reaction in the case of homogeneous catalyst varies depending on the kind of each component and the combination of the components, but is generally such that the amount of the transition metal compound of the component (c) is 0.001 mmol or more, preferably 0.1 mmol or more and 1000 mmols or less, preferably 100 mmols or less for 100 g of the ring-opening polymer. In the case of heterogeneous catalyst, the amount also varies depending on the kind of the catalyst metal and the state of the catalyst metal being supported on the carrier, but is generally such that the amount of the catalyst metal is 0.1 g or more, preferably 1.0 g or more and 20 g or less, preferably 15 g or less for 100 g of the ring-opening polymer. If the hydrogenation catalyst is added in excess to the hydrogenation reaction solution, cost increases and, furthermore, after-treatments such as removal of the hydrogenation catalyst are difficult to perform, and if the amount is too small, the reaction efficiency deteriorates.

The hydrogenation reaction is carried out by introducing hydrogen into the hydrogenation reaction solution, and, for example, a process of sufficiently contacting the introduced hydrogen with the resin under stirring is preferred. Hydrogen pressure is usually 0.1 kgf/cm$^2$ or higher, preferably 2 kgf/cm$^2$ or higher and 100 kgf/cm$^2$ or lower, preferably 50 kgf/cm$^2$ or lower. If the hydrogen pressure is too low, the hydrogenation reaction does not proceed and if it is too high, control of the reaction is difficult and, moreover, side-reactions or gelation may be brought about.

The hydrogenation reaction is carried out usually at 0° C. or higher and 250° C. or lower, and preferably at 20° C. or higher and 200° C. or lower in the case of using a homogeneous catalyst and preferably 200° C. or higher, more preferably 210° C. or higher and 240° C. or lower, more preferably 230° C. or lower in the case of using a heterogeneous catalyst. If the temperature is too low, reaction rate is slow and if it is too high, decomposition or gelation of the ring-opening polymerization polymer and hydrogenation product is apt to take place and, in addition, energy cost increases.

In the present invention, the hydrogenation is carried out so that the hydrogenation rate of the double bond in the main chain is 98% or higher, preferably 99% or higher, more preferably 99.5% or higher, and the hydrogenation rate of the 6-membered ring structure is 90% or higher, preferably 95% or higher, more preferably 98% or higher. If the hydrogenation rate of the main chain is too low, the hydrogenation product is apt to deteriorate due to oxidation or the like under high temperature environment or the like, and if the hydrogenation rate of the 6-membered ring structure is too low, the low birefringence property cannot be obtained. When the 6-membered ring structure is an aromatic ring structure, the hydrogenation rate of the aromatic ring structure may become lower than that of the double bond in the main chain depending on the kind of the hydrogenation catalyst and hydrogenation reaction conditions, but in the case of other 6-membered ring structures, the hydrogenation rate of the 6-membered ring structures is usually equal to that of the double bond in the main chain.

The method for the recovery of ring-opening polymerization polymer hydrogenation product from hydrogenation reaction mixture is not especially limited. As in the case of the recovery of the ring-opening polymerization polymer mentioned above, the ring-opening polymerization polymer hydrogenation product can be precipitated and coagulated by adding the hydrogenation reaction mixture to a large amount of a poor solvent, methanol, isopropanol, acetone or the like, followed by removing the solvent by filtration.

The method for the recovery of the hydrogenated resin from the hydrogenation reaction mixture is not especially limited. As in the case of the recovery of the resin mentioned above, the hydrogenated resin can be precipitated and coagulated by adding the hydrogenation reaction mixture to a large amount of a poor solvent, methanol, isopropanol, acetone or the like, followed by removing the solvent by filtration.

The ring-opening polymerization polymer of the present invention has a number-average molecular weight, in terms of polyisoprene, of 12,000 or more, preferably 14,000 or more, more preferably 15,000 or more and 50,000 or less, preferably 40,000 or less, more preferably 30,000 or less measured by gel permeation chromatography method using cyclohexane solvent and a similarly measured weight-average molecular weight (Mw) of 20,000 or more, preferably 25,000 or more, more preferably 30,000 or more and 80,000 or less, preferably 70,000 or less, more preferably 60,000 or less. Furthermore, molecular weight distribution (Mw/Mn) is preferably 3.0 or less, more preferably 2.8 or less, especially preferably 2.5 or less. If the molecular weight is too small, mechanical strength of the polymer greatly deteriorates and threshold stress decreases when greases or oils stick thereto, and if it is too large, moldability deteriorates. Moreover, when the molecular weight distribution is too great, also the moldability deteriorates.

Glass transition temperature of the hydrogenation product varies depending on the proportion of comonomers, the hydrogenation rate or the like, but is usually 100–200° C. From the point of heat resistance, the glass transition temperature is preferably 100° C. or higher, especially 120° C. or higher, and from the point of moldability or processability, it is preferably 200° C. or lower, especially 180° C. or lower.

A disc of compact disc standards having a thickness of 1.2 mm and a diameter of 12.5 cm prepared using the hydrogenation product of the present invention has a birefringence of 15 nm or less, preferably 10 nm or less in the area of radius 25–60 mm of the disc.

Furthermore, the hydrogenation product of the present invention is excellent in solvent resistance and chemical resistance. When it is dipped in ethyl acetate or acetone at room temperature for 20 hours, no change in appearance is seen, and, moreover, when it is dipped in 97.6% sulfuric acid or 28% aqueous ammonia at room temperature for 20 hours, no change in appearance is seen.

Furthermore, the hydrogenation product of the present invention is excellent in resistance to deterioration with greases and oils and hardly decreases in mechanical strength and hardly breaks even in the state of greases or oils sticking thereto. For example, even when it is dipped in lard at 25° C. for 1 hour, cracks hardly occur and the threshold stress is maintained at 400 kgf/cm$^2$ or more, preferably 600 kgf/cm$^2$ or more, more preferably 750 kgf/cm$^2$ or more.

Additives, etc.

Various additives may be added to the hydrogenation product of the present invention depending on the object. For example, there may be added various additives such as antioxidants of hindered phenol type, phosphite type or the like; heat deterioration inhibitors of phenol type or the like; ultraviolet light stabilizers of benzophenone type or the like; anti-static agents of amine type or the like; lubricants such as esters of aliphatic alcohols, and partial esters or partial ethers of polyhydric alcohols; etc. Furthermore, resins such as ethylene polymers or rubber-like polymers may be added depending on the object as far as the characteristics of the hydrogenation product are not lost.

As the antioxidants, preferred are those which have a vapor pressure of $10^{-6}$ Pa or lower at 20° C. for the prevention of foaming at the time of molding or volatilization from the surface of molded articles at high temperatures. Such antioxidants are as disclosed in JP-A-3-223328, and examples are hindered phenol type antioxidants such as 2,6-di-t-butyl-4-methylphenol, 4-hydroxymethyl-2,6-di-t-butylphenol, 2,6-di-t-butyl-α-methoxy-p-dimethyl-phenol, 2,2'-methylene-bis-(4-methyl-6-tert-butylphenol), 4,4'-methylene-bis-(2,6-di-tert-butylphenol), hindered bisphenol, 4,4'-thiosbis-(6-tert-butyl-3-methylphenol), 4,4'-thiobis-(6-tert-butyl-o-cresol) and tetrakis-[methylene-3-(3', 5'-di-tert-butyl-4'-hydroxyphenyl)propionate]methane; aminophenol type antioxidants such as n-butyl-p-aminophenol, n-butyroyl-p-aminophenol, n-pelargonoyl-p-aminophenol, 2,6-di-tert-butyl-α-dimethyl and amino-p-cresol; hydroquinone type antioxidants such as hydroquinone, 2,5-di-tert-butyl-hydroquinone, 2,5-di-tert-amylhydroquinone and hydroquinonemonobenzyl ether; and phosphite type antioxidants such as triphosphite, tris(2,4-di-tert-butylphenyl) phosphite and tetrakis(2,4-di-tert-butylphenyl)-4,4'- biphenylene phosphanite.

Examples of the lubricants are partial esters of polyhydric alcohols known in JP-A-63-273666, such as glycerin monostearate, glycerin monolaurate, glycerin distearate, pentaerythritol monostearate, pentaerythritol distearate and pentaerythritol tristearate; partial ethers of polyhydric alcohols known in JP-A-3- 39403, such as 3-(4-nonylphenyloxy)-1,2-propanediol, 3-(behenyloxy)-1,2-propanediol and 2,2-bis[4-(2,3-dihydroxypropyloxy) phenyl]propane; etc.

When rubber-like polymer, etc. are added, the transparency of the hydrogenation product of the present invention generally decreases, but according to the amount or the kneading method, the rubber-like polymer disperses in the matrix of the hydrogenation product with forming microdomains, and when microdomains of 0.3 μm or less, especially 0.2 μm or less are formed, the diameter of the rubber-like polymer is smaller than the wavelength of visible light and light scatters with difficulty and, thus, the hydrogenation product is excellent in transparency and this is preferred.

In this case, the smaller the difference between the refractive index of the rubber-like polymer and that of the hydrogenation product of the present invention is, the higher the transparency is. When the amount of the rubber-like polymer is 5–0.5% by weight, the difference is preferably 0.2 or less, more preferably 0.1 or less, especially preferably 0.05 or less, further especially preferably 0.02 or less, and when the amount is less than 0.5% by weight, it is 0.3 or less, more preferably 0.2 or less, especially preferably 0.1 or less, further especially preferably 0.05 or less.

When the kind of hydrogenation products differs, they also differ in the refractive index. For example, refractive index of the rubber-like polymer can be continuously changed by changing the proportion of the monomers or changing the number of unsaturated bonds in the main chain by hydrogenation or the like. It is preferred to select a rubber-like polymer having a suitable refractive index depending on the refractive index of the hydrogenation product used.

As the rubber-like polymers, preferred are those having a glass transition temperature of 40° C. or lower which are known in JP-A-5-247324, etc. Block copolymerized rubber-like polymers can have two or more glass transition temperatures, and in this case the lowest glass transition temperature can be 40° C. or lower. Preferred examples are emulsion polymerized or solution polymerized styrene.butadiene-rubber, styrene.ethylene.butadiene.styrene-block copolymer rubber, styrene.ethylene.propylene.styrene-block copolymer rubber, etc.

When the rubber-like polymer is added to the hydrogenation product, 10–0.01% by weight, preferably 5–0.02% by weight, more preferably 1–0.05% by weight, especially preferably 0.5–0.1% by weight of the rubber-like polymer is added to 90–99.99% by weight, preferably 95–99.98% by weight, more preferably 99–99.95% by weight, especially preferably 99.5–99.9% by weight of the hydrogenation product and is dispersed in the hydrogenation product. If the amount of the rubber-like polymer is too large, transparency, glass transition temperature and heat resistance of the resin decrease. If the amount is too small, no effect of adding the rubber-like polymer can be obtained.

The method of addition is not restricted as far as the rubber-like polymer can be sufficiently dispersed in the hydrogenation product. For example, the rubber-like polymer can be added by a method of adding it to the hydrogenation product in molten state by a mixer, a twin-screw kneader or the like and kneading the mixture, a method of dissolving the rubber-like polymer and the hydrogenation product in a suitable solvent, stirring and dispersing the solution, followed by pouring the dispersion in a poor solvent for them to coagulate the solution, a method of drying the solvent in the above dispersion, and the like.

In the case of kneading, a sufficient shearing force is applied at a hydrogenation product temperature of Tg+50° C.–Tg+150° C. If the hydrogenation product temperature is too low, viscosity increases and kneading is difficult, and if it is too high, the rubber-like polymer is deteriorated and they cannot be kneaded well due to the difference in viscosity or melting point. In this case, since kneading is carried out at a high temperature for a long time, it is preferred to add an antioxidant and, furthermore, it is preferred to add a lubricant for easy kneading. The amounts of the antioxidant and the lubricant are generally about 0.05–5 parts by weight for the antioxidant and about 0.05–0.5 part by weight for the lubricant based on the amount of the hydrogenation product, though they depend on the kind of the antioxidant and the lubricant.

Particularly, the rubber-like polymer forms microdomains when it is sufficiently dispersed in the hydrogenation product. The microdomains are nearly spherical and fluctuation of particle diameter among particles is small. Usually, the diameter is 0.3 μm or less, preferably 0.2 μm or less. Since this diameter is smaller than the wavelength of visible light, reduction in transparency of the hydrogenation product caused by the addition of the rubber-like polymer is small and there is no practical problem.

Molding method

The method for molding the hydrogenation product of the present invention is not limited, and there may be employed methods for molding general thermoplastic resins such as injection molding, extrusion molding, air-pressure molding, vacuum molding and hot-press molding.

Uses

The hydrogenation products of the present invention are useful in a wide variety of fields as various molded articles such as optical materials depending on the characteristics thereof. Examples of the uses are optical materials such as optical discs (magneto-optical discs, phase-changing type optical discs, compact discs, laser discs, etc.), optical lenses (Fθ lens for laser beam printer, camera lens, video camera lens, view finder lens, pickup lens, collimate lens, projecting lens for projection television, projecting lens for OHP, etc.), prisms, diffuser panels, optical cards, optical fibers, optical mirrors, liquid crystal display device substrates, light guiding plates, polarizing films and phase difference films; medical equipments such as containers for liquid, powder or solid medicine (container for liquid medicine used for injection, ampoule, vial, prefilled syringe, bag for infusion, sealed medicine bag, press-through package, container for solid medicine, container for eye lotion, etc.), sampling containers (sampling test tube for blood test, cap for medicine containers, blood-collecting tube, container for test samples, etc.), medical instruments (injectors, etc.), sterilizers for medical instruments (for surgical knife, forceps, gauze, contact lens, etc.), experimental and analytical instruments (beaker, laboratory dish, flask, test tube, centrifugal tube, etc.), medical optical parts (plastic lens for medical test, etc.), piping materials (medical infusion tube, piping, joint, valve, etc.), and artificial internal organs and parts thereof (denture-base, artificial heart, artificial dental root, etc.); equipments for treatment of electronic parts such as containers for treatment or transfer (tank, tray, carrier, case, etc.), protecting materials (carrier tape, separation film, etc.), pipings (pipe, tube, valve, flowmeter, filter, pump, etc.) and containers for liquid (sampling container, bottle, ampoule bag, etc); electrical insulating materials such as coating materials (for electric wire, cable, etc.), household and industrial electronic equipment cases (copying machine, computer, printer, television, video deck, video camera, etc.), structural members (parabolic antenna structural member, flat antenna structural member, radardome structural member, etc.); circuit boards such as general circuit boards (rigid printed circuit board, flexible printed circuit board, multi-layer printed-wiring board, etc.), high-frequency circuit boards (circuit board for satellite communication instruments, etc.); substrates such as transparent conductive films (liquid crystal substrate, photomemory, face heater element, etc.); sealants such as semiconductor sealants (transistor sealant, IC sealant, LSI sealant, LED sealant, etc.), sealants for electric and electronic parts (motor sealant, condenser sealant, switch sealant, sensor sealant, etc.); interior automotive trims such as room mirror, covers for meters, etc; exterior automotive trims such as door mirror, fender mirror, lens for beam and light cover; etc.

EXAMPLE

The present invention will be specifically explained by the following examples and comparative examples.

Example 1

Preparation of ring-opening polymerization polymer

To 690 parts by weight of dehydrated toluene were added, in a nitrogen atmosphere, 300 parts by weight of MTF, 1.1 part by weight of 1-hexene, 11 parts by weight of a 0.3 wt % solution of tungsten chloride in toluene and 0.6 part by weight of tetrabutyltin, followed by carrying out polymerization at 60° C. under atmospheric pressure for 1 hour. According to measurement by high performance liquid chromatography using toluene as a solvent (in terms of polystyrene), the resulting polymer had a number-average molecular weight (Mn) of 17,700, a weight-average molecular weight (Mw) of 35,400 and a molecular weight distribution (Mw/Mn) of 2.00.

Preparation of hydrogenation product

To 240 parts by weight of the polymerization reaction solution were added 6 parts by weight of a nickel catalyst supported on alumina (0.70 part by weight of nickel and 0.2 part by weight of nickel oxide in 1 part by weight of the catalyst; pore volume: 0.8 cm$^3$/g; specific surface area: 300 m$^2$/g and 5 parts by weight of isopropyl alcohol, and reaction was carried out at 230° C. under 45 kgf/cm$^2$ for 5 hours in an autoclave.

The hydrogenation reaction solution from which the hydrogenation catalyst was removed by filtration was poured with stirring into a mixed solution comprising 250 parts by weight of acetone and 250 parts by weight of isopropanol to precipitate a resin, which was recovered by filtration. The resin was washed with 200 parts by weight of acetone and, then, dried at 100° C. for 24 hours in a vacuum dryer having a reduced pressure of lower than 1 mmHg. The yield was 99%. The hydrogenation rate of the double bond in the polymer main chain was 99.9% or higher and that of the aromatic ring structure was 99.8% according to $^1$H-NMR. According to measurement by high performance liquid chromatography using cyclohexane as a solvent (in terms of polyisoprene), the resulting hydrogenation product had a number-average molecular weight (Mn) of 22,600, a weight-average molecular weight (Mw) of 42,500, a molecular weight distribution (Mw/Mn) of 1.88 and a glass transition temperature (Tg) of 136° C. Stress-optical coefficients $C_R$, $C_G$ of a press molded sheet of 1 mm thick were $1370 \times 10^{-12}$ Pa$^{-1}$ and $-5.0 \times 10^{-12}$ Pa$^{-1}$.

The hydrogenation product was injection molded at 350° C. to prepare a doughnut-shaped disc of 1.2 mm thick and 12.5 cm in diameter which met the standard of compact disc. A light transmittance (wavelength 830 nm), a birefringence (double passes, wavelength 633 nm) and water absorption of the disc were measured. As a result, the light transmittance was 91%, the birefringence (area of radius 25–60 mm of the disc) was 10 nm or less and the water absorption was 0.1% or less. Thus, it is shown that the hydrogenation product of the present invention is superior to the resin of comparative example in birefringence.

This disc hazed when subjected to steam treatment at 121° C. for 30 minutes in an autoclave.

Similarly, a plate of 1 mm thick, 90 mm×10 mm was prepared. An elliptic cylinder of 10 mm in height having an elliptic section of 200 mm in longer diameter and 80 mm in shorter diameter was divided into four parts of the same shape to make jigs. The above plate was fixed on the curved surface of the jigs and dipped in lard at 25° C. for 1 hour to find no cracks. The threshold stress was 750 kgf/cm$^2$ or more. Thus, it is shown that the hydrogenation product of the present invention is superior to the resin of comparative example in resistance to deterioration with greases and oils.

The solvent resistance was evaluated by dipping the above disc in ethyl acetate and acetone at room temperature for 20 hours and observing the change of appearance. The chemical resistance was evaluated by dipping the disc in 97.6% sulfuric acid and 28% aqueous ammonia at room temperature for 20 hours and observing the change of appearance. As a result, no change of appearance was seen in both the tests and, thus, it can be seen that the hydrogenation product of the present invention is excellent in solvent resistance and chemical resistance.

Example 2

A ring-opening polymerization polymer was obtained in the same manner as in Example 1, except that the amount of 1-hexene was changed to 0.9 part by weight. According to measurement by high performance liquid chromatography using toluene as a solvent (in terms of polystyrene), the resulting polymer had a number-average molecular weight (Mn) of 24,700, a weight-average molecular weight (Mw) of 47,800 and a molecular weight distribution (Mw/Mn) of 1.94.

Subsequently, hydrogenation reaction was carried out in the same manner as in Example 1, except that the reaction temperature was 210° C. The hydrogenation rate of the double bond in the polymer main chain was 99.9% or higher and that of the aromatic ring structure was 99.6% according to $^1$H-NMR. According to measurement by high performance liquid chromatography using cyclohexane as a solvent (in terms of polyisoprene), the resulting hydrogenation product had a number-average molecular weight (Mn) of 34,300, a weight-average molecular weight (Mw) of 63,700, a molecular weight distribution (Mw/Mn) of 1.86 and a glass transition temperature (Tg) of 156° C. $C_R$ and $C_G$ were $1170 \times 10^{-12}$ Pa$^{-1}$ and $-7.8 \times 10^{-12}$ Pa$^{-1}$, respectively.

A disc was prepared in the same manner as in Example 1 and the properties were measured in the same manner as in Example 1. As a result, the light transmittance was 90%, the birefringence (area of radius 25–60 mm of the disc) was 10 nm or less and the water absorption was 0.1% or less. The disc was dipped in lard as in Example 1 to find no cracks, and the threshold stress was 750 kgf/cm$^2$ or more.

Furthermore, the solvent resistance and the chemical resistance were evaluated in the same manner as in Example 1 to find that the disc was not affected by solvents and chemicals.

Example 3

Using the ring-opening polymerization polymer obtained in Example 1, hydrogenation reaction was carried out in the same manner as in Example 1, except that a hydrogenation catalyst comprising palladium supported on silica was used and the reaction temperature was changed to 170° C. The hydrogenation rate of the double bond in the polymer main chain was 99.9% or higher and that of the aromatic ring structure was 99.7% according to $^1$H-NMR. According to measurement by high performance liquid chromatography using cyclohexane as a solvent (in terms of polyisoprene), the resulting hydrogenation product had a number-average molecular weight (Mn) of 23,700, a weight-average molecular weight (Mw) of 45,600, a molecular weight distribution (Mw/Mn) of 1.92 and a glass transition temperature (Tg) of 148° C. $C_R$ and $C_G$ were $1200 \times 10^{-12}$ Pa$^{-1}$ and $-7.0 \times 10^{-12}$ Pa$^{-1}$, respectively.

A disc was prepared in the same manner as in Example 1 and the properties were measured in the same manner as in Example 1. As a result, the light transmittance was 91%, the birefringence (area of radius 25–60 mm of the disc) was 10 nm or less and the water absorption was 0.1% or less. The disc was dipped in lard as in Example 1 to find no cracks, and the threshold stress was 750 kgf/cm$^2$ or more.

Furthermore, the solvent resistance and the chemical resistance were evaluated in the same manner as in Example 1 to find that the disc was not affected by solvents and chemicals.

Example 4

To the hydrogenation product obtained in Example 1 were added 0.1 part by weight of a polyhydric alcohol partial ester type lubricant (Unister H476D manufactured by Nippon Oil & Fats Co., Ltd.), 0.4 part by weight of an antioxidant (Irganox 1010 manufactured by Ciba-Geigy Corp., tetrakis-[methylene-3-(3',5'-di-tert-butyl-4'-hydroxyphenyl)propionate]methane) and 0.25 part by weight of a styrene-.ethylene.butadiene.styrene block copolymer (Taftec H1051D manufactured by Asahi Kasei Kogyo K.K.), followed by kneading the mixture by a twin-screw kneader (TEM-35B manufactured by Toshiba Machine Co., Ltd., screw diameter: 37 mm; L/D=32; screw revolution number: 250 rpm; resin temperature: 265° C.: feed rate: 10 kg/hour).

Processing was carried out in the same manner as in Example 1, except that the above composition was used in place of the hydrogenation product obtained in Example 1. As a result, the disc of 1.2 mm thick and 12.5 cm in diameter had a light transmittance (wavelength 830 nm) of 90%, a birefringence (double passes, wavelength 633 nm) of 10 nm or less, and a water absorption of 0.1 or less. Furthermore, the plate of 1 mm thick, 90 mm×10 mm was evaluated on the resistance to deterioration with greases and oils in the same manner as in Example 1 to find no cracks. The threshold stress after dipping in lard was 750 kgf/cm² or more. No change of appearance was seen after dipping in ethyl acetate, acetone, 97.6% sulfuric acid and 28% aqueous ammonia. Moreover, no haze was seen when the disc was subjected to steam treatment at 121° C. for 30 minutes in an autoclave.

Comparative Example 1

A ring-opening polymer hydrogenation product was obtained in the same manner as in Example 1, except that dicyclopentadiene was used in place of MTF. The hydrogenation rate of the double bond was 99.9% or higher according to $^1$H-NMR. According to measurement by high performance liquid chromatography using cyclohexane as a solvent (in terms of polyisoprene), the resulting hydrogenation product had a number-average molecular weight (Mn) of 24,400, a weight-average molecular weight (Mw) of 55,000, a molecular weight distribution (Mw/Mn) of 2.25 and a glass transition temperature (Tg) of 92° C. $C_R$ and $C_G$ were $1950 \times 10^{-12}$ Pa$^{-1}$ and $-9.9 \times 10^{-12}$ Pa$^{-1}$, respectively.

A disc was prepared in the same manner as in Example 1 and the properties were measured in the same manner as in Example 1. As a result, the light transmittance was 91%, the birefringence (area of radius 25–60 mm of the disc) was 30 nm or less and the water absorption was 0.1% or less. When it was fixed on the jigs and dipped in lard as in Example 1, it was broken, and the threshold stress was 73 kgf/cm².

Comparative Example 2

A ring-opening polymer hydrogenation product was obtained in the same manner as in Example 1, except that 6-methyl-1,4:4,8-dimethano-1,4,4a,5,6,7,8,8a-octahydronaphthalene was used in place of MTF. The hydrogenation rate was 99.9% or higher. According to measurement by high performance liquid chromatography using cyclohexane as a solvent (in terms of polyisoprene), the resulting hydrogenation product had a number-average molecular weight (Mn) of 27,800, a weight-average molecular weight (Mw) of 69,500, a molecular weight distribution (Mw/Mn) of 2.50 and a glass transition temperature (Tg) of 151° C. CR and $C_G$ were $1720 \times 10^{-12}$ Pa$^{-1}$ and $-13.0 \times 10^{-12}$ Pa$^{-1}$, respectively.

A disc was prepared in the same manner as in Example 1 and the properties were measured in the same manner as in Example 1. As a result, the light transmittance was 91%, the birefringence (area of radius 25–60 mm of the disc) was 40 nm or less and the water absorption was 0.1% or less. When it was fixed on the jigs and dipped in lard as in Example 1, it was broken, and the threshold stress was 114 kgf/cm².

Furthermore, the solvent resistance and the chemical resistance were evaluated in the same manner as in Example 1 to find that the disc was not affected by solvents and chemicals.

Comparative Example 3

Polymerization and hydrogenation were carried out in the same manner as in Example 1, except that 1-hexene was added in an amount of 1.8 parts by weight. The hydrogenation rate of the main chain was 99.9% or higher and that of the aromatic ring structure was 99.5%. According to measurement by high performance liquid chromatography using cyclohexane as a solvent (in terms of polyisoprene), the resulting hydrogenation product had a number-average molecular weight (Mn) of 8,500, a weight-average molecular weight (Mw) of 18,100, a molecular weight distribution (Mw/Mn) of 2.10 and a glass transition temperature (Tg) of 138° C. $C_R$ and $C_G$ were $1200 \times 10^{-12}$ Pa$^{-1}$ and $-5.5 \times 10^{-12}$ Pa$^{-1}$, respectively. This hydrogenation product was the same in its structure as the hydrogenation product of the present invention, except that the molecular weight was less than 12,000.

A disc was prepared in the same manner as in Example 1 and the properties were measured in the same manner as in Example 1. As a result, the light transmittance was 91%, the birefringence (area of radius 25–60 mm of the disc) was 10 nm or less and the water absorption was 0.1% or less. When it was fixed on the jigs and dipped in lard as in Example 1, it was broken, and the threshold stress was 85 kgf/cm².

Furthermore, the solvent resistance and the chemical resistance were evaluated in the same manner as in Example 1 to find that the disc was not affected by solvents and chemicals.

Comparative Example 4

An equimolar mixture of 3a,4,7,7a-tetra-hydroindene of higher than 99% in purity and cyclopentadiene was subjected to Diels-Alder reaction in an autoclave at 230° C. The reaction mixture was recovered and distilled to obtain a mixture of 1,4-methano-1,4,4a,4b,5,8,8a,9a-octahydro-9H-fluorene and 5,8-methano-3a,4,4a,5,8,8a,9,9a-octahydro-1H-benzoindene which contained 40% of a cyclopentadiene trimer.

Analysis of the mixture by gas chromatography showed that the proportion of 1,4-methano-1,4,4a,4b,5,8,8a,9a-octahydro-9H-fluorene and 5,8-methano-3a,4,4a,5,8,8a,9,9a-octahydro-1H-benzoindene was nearly equimolar and 15% of the cyclopentadiene trimer was 1,4:5,8-dimethano-1,4,4a,4b,5,8,8a,9a-octahydro-9H-fluorene.

The mixture was further fractionated to obtain a fraction of 101–105° C. under the conditions of 2 mmHg and a reflux ratio 1/20. Analysis by gas chromatography gave a cyclopentadiene trimer content of 0.5% in this fraction.

A ring-opening polymer was obtained in the same manner as in Example 1, except that the above fraction was used in place of MTF. The resulting polymer had a number-average molecular weight (Mn) of 18,400, a weight-average molecular weight (Mw) of 42,100 and a molecular weight distribution (Mw/Mn) of 2.29.

Subsequently, a hydrogenation product was obtained in the same manner as in Example 1. The hydrogenation rate of the double bond in the polymer main chain was 99.9% or higher and that of the ring structure was 99.9% according to $^1$H-NMR. According to measurement by high performance liquid chromatography using cyclohexane as a solvent (in terms of polyisoprene), the resulting hydrogenation product had a number-average molecular weight (Mn) of 28,400, a weight-average molecular weight (Mw) of 62,200, a molecular weight distribution (Mw/Mn) of 2.19 and a glass transition temperature (Tg) of 128° C. Stress-optical coefficients $C_R$ and $C_G$ measured using a press molded sheet of 1 mm thick were $2100\times10^{-12}$ $Pa^{-1}$ and $-8.0\times10^{-12}$ $Pa^{-1}$, respectively.

A disc was prepared in the same manner as in Example 1 and the properties were measured in the same manner as in Example 1. As a result, the light transmittance was 90%, the birefringence (area of radius 25–60 mm of the disc) was 18 nm or less and the water absorption was 0.1% or less. When the disc was fixed on the jigs and dipped in lard as in Example 1, it was broken, and the threshold stress was 120 kgf/cm$^2$.

The ring-opening polymerization polymer of the present invention is excellent in transparency, heat resistance, water resistance, solvent resistance and chemical resistance, and, in addition, excellent in low birefringence property and resistance to deterioration with greases and oils.

We claim:

1. A hydrogenation product of a ring-opening polymerization polymer which comprises 70–100% by weight of a norbornene monomer comprising 1,4-methano-1,4,4a,9a-tetrahydrofluorene and 0–30% by weight of other monomer copolymerizable with the said norbornene monomer, the degree of hydrogenation of the double bond in the main chain being 98% or higher, the degree of hydrogenation of the 6-membered ring structure being 90% or higher, and the number-average molecular weight (Mn) measured by gel permeation chromatography being 12,000 or more in terms of polyisoprene.

2. A hydrogenation product of a ring-open polymerization polymer according to claim 1 which is a hydrogenation product of a ring-opening polymer of 90–100% by weight of 1,4-methano-1,4,4a,9a-tetrahydrofluorene and 0–10% by weight of other monomer copolymerizable with said monomer.

3. A hydrogenation product of a ring-opening polymerization polymer according to any one of claims 1 or 2 which has an Mw/Mn of 3.0 or less.

4. A hydrogenation product of a ring-opening polymerization polymer according to any one of claims 1 or 2 which has a threshold stress of 400 kgf/cm$^2$ or more after dipped in lard at 25° C. for 1 hour.

5. A resin composition which comprises 90–99.99% by weight of the hydrogenation product of the ring-opening polymerization polymer according to any one of claims 1 or 2 and 10–0.01% by weight of a rubber polymer.

6. A resin composition according to claim 5, wherein the rubber polymer has a glass transition temperature of 40° C. or lower.

7. A resin composition according to claim 5 wherein the rubber polymer is a styrene-butadiene-rubber, a styrene.ethylene.butadiene.styrene-block copolymer rubber or a styrene.ethylene.propylene.styrene-block copolymer rubber.

8. A resin composition according to any one of claims 5–7, wherein the rubber polymer is dispersed in a matrix of the ring-opening polymer hydrogenation product with forming microdomains of 0.3 μm or less in particle diameter.

9. A hydrogenation product of a ring-opening polymerization polymer according to claim 1 which comprises 80–100% by weight of said norbornene monomer and 0–20% by weight of monomer copolymerizable with said monomer.

10. A hydrogenation product of a ring-opening polymerization polymer according to claim 1 wherein said other monomer is selected from the group consisting of 2-norbornene, 5-methyl-2-norbornene, 5,5-dimethyl-2-norbornene, 5-ethyl-2-norbornene, 5-butyl-2-norbornene, 5-ethylidene-2-norbornene, 5-methoxycarbonyl-2-norbornene, 5-cyano-2-norbornene, 5-methyl-5-methoxycarbonyl-2-norbornene, 5-hexyl-2-norbornene, 5-octyl-2-norbornene, 5-octadecyl-2-norbornene, 1,4:5,8-dimethano-1,2,3,4,4a,5,8,8a-octahydro-2,3-cyclopentadienonaphthalene, 6-methyl-1-,4:5,8-dimethano-1,4,4a,5,8,8a-octahydronaphthalene, 1,4:5,10:6,9-trimethano-1,2,3,4,4a,5,5a,6,9,9a,10,10a-dodecahydro-2,3-cyclopentadienoanthracene, and dicyclopentadiene, 2,3-dihydrodicyclopentadiene.

* * * * *